United States Patent [19]

Hilpert

[11] Patent Number: 4,609,970
[45] Date of Patent: Sep. 2, 1986

[54] BOARD HOLDING DEVICE, IN PARTICULAR FOR RF PRINTED CIRCUIT BOARDS, AND A METHOD OF MANUFACTURING IT

[75] Inventor: Bruno Hilpert, Küssaberg, Fed. Rep. of Germany

[73] Assignee: BBC Brown, Boveri & Company, Limited, Baden, Switzerland

[21] Appl. No.: 592,279

[22] Filed: Mar. 22, 1984

[30] Foreign Application Priority Data

Mar. 25, 1983 [CH] Switzerland ............... 1649/83

[51] Int. Cl.[4] ............... H05K 1/18
[52] U.S. Cl. ............... 361/399; 361/395; 361/412
[58] Field of Search ............... 361/395, 399, 315, 415; 174/52 FP; 219/129, 85 R, 85 CA, 85 CM, 233, 234; 228/56 R, 56 A, 179, 180 R, 180 A; 339/275 B

[56] References Cited

U.S. PATENT DOCUMENTS 3,806,767  4/1974  Lehrfeld ............... 361/412
3,992,653  11/1976  Richardson et al. ............... 361/412 X
4,517,625  5/1985  Frink et al. ............... 361/413 X

FOREIGN PATENT DOCUMENTS 2246154  5/1975  France ............... 361/413

Primary Examiner—R. R. Kucia
Assistant Examiner—Tarick Basma
Attorney, Agent, or Firm—Oblon, Fisher, Spivak, McClelland & Maier

[57] ABSTRACT

In a board holding device for a board (1) provided with a circuit, in which the board (1) is inserted in the groove (3, 3') of an elongate frame part (2, 2'), the mechanical and electrical connection between the board (1) and the frame part (2, 2') is produced by a solder connection which is carried out by means of solder ducts (4, 4') filled with a solder. The board holding device can be supplemented in a simple manner by cover plates to give a complete screening or resonance casing which has good electrical and mechanical properties. The holding device is very suitable for automated manufacture.

5 Claims, 5 Drawing Figures

BOARD HOLDING DEVICE, IN PARTICULAR FOR RF PRINTED CIRCUIT BOARDS, AND A METHOD OF MANUFACTURING IT

FIELD OF THE INVENTION

The invention concerns a board holding device, in particular for RF printed circuit boards.

BACKGROUND OF THE INVENTION

Board holding devices have long been used in electronic equipment in which certain circuit components, combined to form sub-assemblies, are located on a number of printed circuit boards and retained so as to be exchangeable. The frame parts, which are generally manufactured from an insulating plastic, have grooves in their longitudinal direction. The grooves are matched to the dimensions of the printed circuit board in such a way that the board can be inserted without difficulty from the front and can also be withdrawn again. Multiple contact strips are often attached transversely to the groove direction at the rear end of the frame parts, into which multiple contact strips corresponding devices on the printed circuit board are inserted automatically when the board is pushed in, making the necessary electrical connections to other circuit components.

Whereas the frame parts described only represent mechanically effective holders with no electrical duty, it is often essential in the case of circuits which are exceptionally sensitive to interference or, for example, high-frequency circuits, to accommodate the printed circuit boards in a screening metal casing which is in good conductive connection with the ground conductor of the circuit, and to modify the holding devices in a suitable manner. In particular, however, it is increasingly important, in the case of very high operating frequencies in the GHz range, so to design the casing geometry that the desired high frequency properties are obtained in conjunction with the printed circuit board and its circuit. This leads to the construction of casings, manufactured to a large extent in advance, often milled or bent from sheet metal and soldered together, in which casings the printed circuit boards are subsequently inserted and then fastened.

This type of casing construction is, firstly, very expensive to manufacture. Secondly, however, it provides problems in producing an electrically reliable, large-area ground contact between the circuit and the screen subsequent to the installation of the board.

OBJECT OF THE INVENTION

The object of the present invention is, therefore, to provide a board holding device which, in addition to simple construction, permits complete screening, which allows the production of very good and resistant electrical and mechanical connection between the circuit and the screening casing, and which can be implemented without large costs.

ADVANTAGES OF THE INVENTION

The board holding device according to the invention has the advantage that it exhibits a mechanically and electrically secure connection between the board and the frame parts, can be extended without problems to a high frequency-resistant screening casing by means of corresponding upper and lower cover plates, and can be manufactured, with the aid of the solder ducts, in a simple manner suitable for automated production.

SUMMARY OF THE INVENTION

In the method for manufacturing the board holding device in accordance with the invention, the board is first inserted with its edges into the grooves of the frame parts provided with the solder ducts. A suitable solder is then filled into the solder ducts from above. The frame parts are subsequently heated to a temperature above the melting temperature of the solder used and kept above the melting temperature until the solder, which becomes a liquid, has flowed out of the solder ducts on both sides and has flowed between the board edges and the inner surfaces of the grooves and has been distributed there. Finally, a solid solder connection between the board and the frame parts is produced by cooling.

BRIEF DESCRIPTION OF THE DRAWINGS

The invention is now described and explained in more detail below in embodiment examples using the drawings. In the drawings.

DETAILED DESCRIPTION OF THE PRESENTLY PREFERRED EMBODIMENTS

Figure 1:
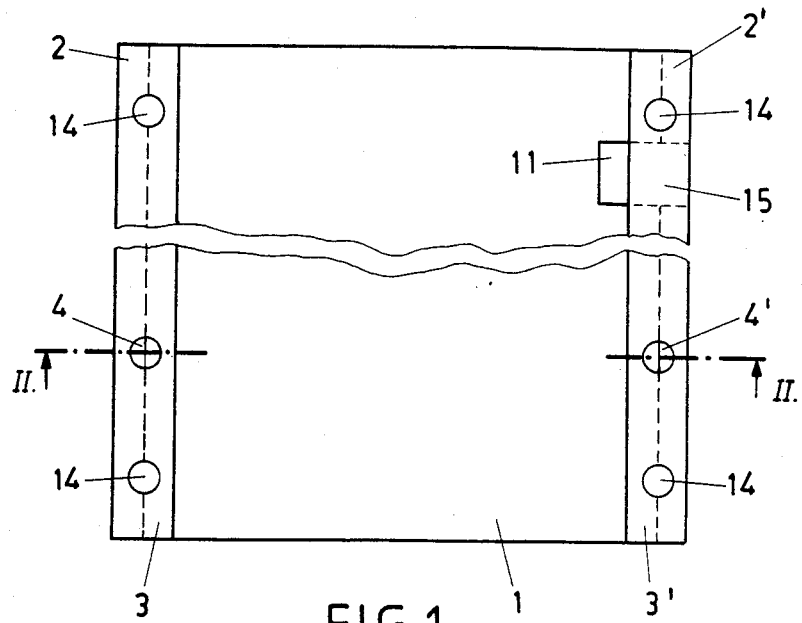
FIG. 1 shows a board holding device in accordance with the invention, in plane view.

FIG. 1 shows a board holding device in accordance with the invention in plane view. A board 1, for example a Teflon or polyether sulfone board coated on both sides with copper and provided with strip conductors, is located between two elongate and rod-shaped frame parts 2'. The opposite edges of the board 1 are inserted into corresponding grooves 3 and 3', the depths of which are indicated by the dotted lines in the frame parts 2, 2'. Solder ducts 4 and 4' run from the upper side of the frame parts 2, 2' to the grooves 3, 3' located underneath and, by this means, connect the latter to the exterior. In addition to these solder ducts 4, 4', various types of fastening holes 14 can also be provided in the frame parts 2, 2'. The fastening holes in the form of penetration holes or threaded holes serve to connect the frame parts 2, 2' to a support and/or cover plates. In addition, it is possible to leave recesses 11 free at the edge of the board. The recesses, in association with a corresponding penetration hole 15 through the frame part 2', provide space for externally operable circuit elements, for example trimmers, or for electricity supplies via bushing-type capacitors.

Figure 2:
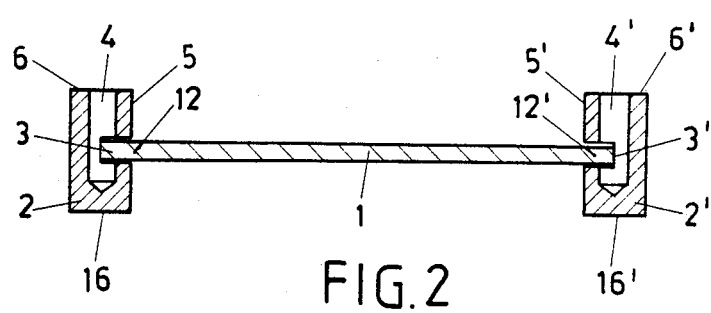
FIG. 2 shows the cross-section through a board holding device according to FIG. 1 in the plane indicated by the line II—II in FIG. 1.

FIG. 2 shows the cross-section through a board holding device in accordance with FIG. 1 in a plane indicated by the line II—II in FIG. 1. The frame parts 2, 2' typically have prismatic cross-section. The grooves 3, 3' run in the longitudinal direction on the inner sides 5, 5' of the frame and have a depth of several millimeters which suffices, on the one hand, to provide the board 1 with sufficient support and, on the other hand, does not require an unnecessarily large area of the board 1. If the board 1 is a double-sided printed circuit board which is fitted on the upper and lower sides with electronic components of a certain installation height, it is desirable that the grooves 3 and 3' should run in the central region of the frame inner sides 5, 5' in order to gain sufficient space on both sides of the board within the completed screening casing.

The solder ducts 4, 4' extend non-parallel with said grooves from the frame upper sides 6, 6' non-parallel with said inner sides at least as far as the grooves 3, 3' but are closed towards the frame lower sides 16 and 16' so that, during soldering, the liquid solder can flow out of the solder ducts 4, 4' into the grooves 3, 3' but not downwards out of the grooves. For series manufacture of the frame parts 2, 2', it is advantageous to design the solder ducts 4, 4' as blind holes normal to the board 1. The blind holes are deep enough to extend through the grooves 3, 3', if soldering is to occur on both sides, and are so located by their centre lines relatives to the groove depth that they are only partially intersected by the grooves. Such blind holes are very simple to produce using automatic drilling machines. In particular, however, their arrangement means that the melted solder located in the solder ducts 4, 4' can, without hindrance, wet the board edges 12, 12' in the grooves 3, 3' around the board edges from both sides during soldering. In this manner, soldering on both sides between the board 1 and the frame parts 2, 2' can be carried out in one operation. The soldering generally extends over the total length of the frame parts 2, 2' in order to permit, in this manner, a closed mechanical and electrical transition between them and the board 1.

In certain cases, however, it is advantageous to provide the previously mentioned recess 11 at the edge of the board, as drawn in FIG. 1. A trimmer can be located, for example horizontally, in this recess 11. The trimmer is connected to the circuit by strip conductors on the board 1. Since such a recess 11 interrupts the continuous soldering of the board edge 12', solder ducts must be provided in this case on both sides of the recess 11 so that the solder necessary for the soldering procedure can be supplied to both sides.

With respect to the quality of the soldering and, in particular, for good HF and screening properties of the frame parts 2, 2' and the cover plates connected to them, it is desirable that the frame parts 2, 2' should possess a surface which combines outstanding soldering capability with excellent electrical conductivity. This is attained very advantageously and, at the same time, economically when the frame parts are solidly manufactured from an inexpensive metal, for example brass, and have a silver-plated surface. It is then simultaneously advantageous that the soldered connection be made by a solder saturated with silver, this means preventing silver from the surface layer of the frame parts from going into solution during the soldering process and adversely affecting the quality of the soldered joint.

The distribution of liquid solder from the solder ducts 4, 4' into the slot-shaped spaces formed between the grooves 3, 3' and the board edges 12, 12' on both sides of the board edges occurs by means of capillary forces and is therefore closely associated with the geometric dimensions of these spaces. So that the capillary forces may become effective but also so that the quantity of solder required is kept small, it is advantageous that the width of the grooves 3, 3' should only exceed the thickness of the board edges 12, 12' lying within them by less than 0.2 mm. Thus, if the thickness is, for example, 1.6 mm, excellent results in terms of the solder connection are obtained with a groove width of 1.7 mm. The appropriate distribution of the various solder ducts along the frame parts depends on the pretreatment of the surfaces to be soldered, on the flow properties of the solder used, and on the geometric dimensions of the frame parts 2, 2' and the board 1. If the solder from a solder duct penetrates only a few millimeters sidewards into the gaps between the frame part and the board edge, the solder ducts must be provided at a spacing which is correspondingly closer than if the maximum spreading distance is several centimeters. In the case of frame parts with silver-plated surface and a groove depth of approximately 2.5 mm and when using a conventional soft solder, distances between adjacent solder ducts of 10–30 mm have proved successful.

Figure 3:
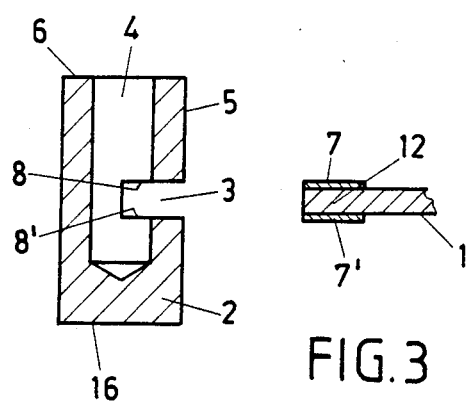
FIG. 3 shows an enlarged cross-section through a frame part and the associated board edge before insertion of the board into the groove.

FIG. 3 shows an increased scale cross-section through a frame part 2 and the edge part of the board 1 before assembly. The groove inner surfaces 8 and 8' are used for the soldering, which surfaces in the inserted condition are opposite to edge surfaces 7 and 7'. In the case of a conventional printed circuit board, these edge surfaces 7, 7' are copper layers having a width which is at least approximately as large as the groove depth and having a surface which can be pretreated to improve the solder capability (i.e., the surface can be pretinned). It is particularly advantageous if the edge surfaces 7, 7' are somewhat wider than the groove depth because, in this case, the quality of the soldering can be optically inspected after the soldering procedure by means of the visible solder strip. The edge surfaces 7, 7' are part of the printed conductor system on the board and provide the electrical connection between the circuit and the frame part 2.

Figure 4:
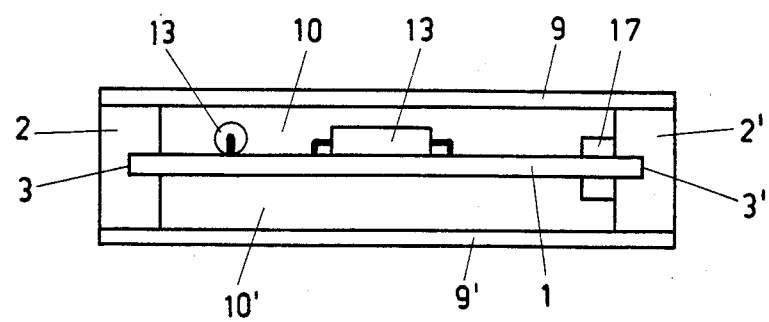
FIG. 4 shows a board holding device completed by cover plates with an internally located and screened electronic circuit.

The screening of the circuit is completed in the manner shown in FIG. 4. The screening casing is closed above and below by electrically conductive cover plates 9 and 9', which butt against the frame parts 2 and 2' with good electrical contact and are fastened to them. The lower cover plate 9' can, however, also be replaced by a larger conducting carrier plate, which takes over the lower part of the screening duty, and, in addition, carries further board holding devices of the same type. The transverse sides can be covered in conjunction with the open top if an upper cover plate 9 with angled and matched side surfaces is used.

The arrangement of three parallel boards 9, 1 and 9', shown in FIG. 4, of which the central board 1 carries a circuit with electronic components 13 and, in certain cases, externally operable trimmers 17, forms two hollow spaces 10 and 10', which can be advantageously used for constructing circuit elements, in particular inductivities and capacities for very high-frequency applications in the GHz range. By means of correspondingly designed conductor areas on both sides of the board 1, which areas are located opposite to the conducting cover plates, it is possible, for example, to construct resonance elements in conjunction with the cover plates. The resonance elements have fixed geometry because of the solid mechanical construction of the board holding device and possess reproducible electrical properties.

In the manufacture of the board holding device, the solder is filled into the solder ducts 4, 4' after the board 1, which has not normally been fitted with components, has been inserted with board edges 12 and 12' into the grooves 3, 3' of the frame parts 2 and 2'. This can occur in such a manner that pieces of solder wire of the necessary length and having a diameter not much smaller than that of the solder duct are introduced into the solder duct. On heating, the molten solder then fills the solder duct and spreads out sideways along the grooves from the solder duct. In order to improve the wetting by the solder of the groove inner surfaces 8 and 8', it is advantageous to previously treat the grooves 3, 3' with a flux appropriate to the solder used. This can be accomplished in a manner already known to those skilled in the art. In the case of automated manufacture, however, it is also particularly favourable to introduce the solder together with a flux in the form of a finely mixed cream-type soldering paste. Such a paste can be put into the solder ducts in exactly the quantity necessary by means of a metering machine, the fine distribution of the flux facilitating the flow and the wetting action of the solder in the narrow gaps between the frame part and the board edge. Good results have been obtained with a low melting point solder having a melting temperature of approximately 180° C.

Figure 5:
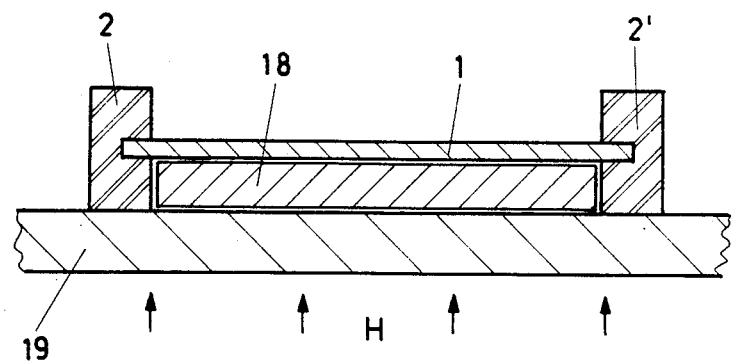
FIG. 5 shows, in cross-section, a preferred arrangement for producing the solder connection.

After the solder has been filled into the solder ducts, the frame parts are heated to the point where the solder in the solder ducts melts and flows into the grooves. So that the flow process is not adversely affected by a markedly different temperature distribution in the frame parts 2, 2', the heating should be carried out as evenly as possible over the total frame length . This can be achieved with a soldering arrangement such as is shown in FIG. 5. The frame parts 2, 2' together with the inserted board 1 are placed on a plane support 19 which conducts heat well and which is heat-distortion-resistant. The underside of the support 19 is then heated with the necessary heat H, and the support 19 evenly distributes the temperature because of its good heat conductivity. In addition, it is advantageous to protect the board 1 from the heat radiation and convection of the support 19 by means of a heat-resistant and heat-insulating intermediate layer 18 which is located between the board 1 and the support 19. In the case of automated manufacture, it is also expedient to heat the frame parts 2 and 2' for the soldering process by means of a strong current flowing substantially parallel to the grooves 3, 3'. The current is conducted through the frame parts by means of electrical contacts attached to the ends.

Overall, a board holding device in accordance with the invention proves a mechanically stable and electrically reliable arrangement for a printed circuit board which, on the one hand, requires a good ground connection and which must, on the other hand, be sufficiently screened. A particular advantage of the holding device lies in the fact that its manufacture can take place automatically in a simple manner.

I claim:
1. A high-frequency circuit device, comprising:
   a circuit board with a first board edge and a second board edge opposed to said first board edge;
   a first elongate frame part having a length extending in parallel with said first board edge;
   a second elongate frame part having a length extending in parallel with said second board edge, each of said first and second frame parts having the form of a bar with a rectangular cross section, each of said first and second frame parts having on a first side a groove parallel to the length of said frame parts, said circuit board being inserted with said first and second board edges into said grooves of said first and second frame parts respectively, said circuit board having at least one metallized surface over those regions of said first and second board edges which lie within said grooves, and said circuit board being soldered to said frame parts with the solder making a close connection between said metallized regions and said frame parts; and
   at least one solder duct extending from each of said grooves to a second side of a respective frame part orthogonal to said first side.
2. A high-frequency circuit device according to claim 1, wherein said solder ducts are designed as blind holes perpendicular to the length of said frame parts and to the circuit board, and wherein said solder ducts are partially intersected by said grooves.
3. A high-frequency circuit device according to claim 1, wherein said circuits board is metallized on a surface opposite said at least one surface over said regions which lie within said grooves, and wherein said solder ducts extend through said grooves.
4. A high-frequency circuit device according to claim 1, wherein said frame parts have silver-plated surfaces on at least said first sides, and wherein said solder connection between said circuit board and said frame parts contains a solder saturated with silver.
5. A high-frequency device according to claim 1, wherein the width of said grooves exceeds the thickness of said circuit board by less than 0.2 mm.

* * * * *